(12) United States Patent  
Teng

(10) Patent No.: US 8,531,220 B1
(45) Date of Patent: Sep. 10, 2013

(54) LOOP FILTER

(71) Applicant: Etron Technology, Inc., Hsinchu (TW)

(72) Inventor: Kuang-Fu Teng, Ping-Tung County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 13/901,575

(22) Filed: May 24, 2013

Related U.S. Application Data

(63) Continuation of application No. 13/433,278, filed on Mar. 28, 2012, now Pat. No. 8,476,946.

(51) Int. Cl.
*H03L 7/06* (2006.01)
(52) U.S. Cl.
USPC .............................. 327/156; 327/147; 327/532
(58) Field of Classification Search
USPC .......................................... 327/147, 156, 532
See application file for complete search history.

(56) References Cited

U.S. PATENT DOCUMENTS

| 5,589,795 | A  | * | 12/1996 | Latva-Aho ..................... 327/553 |
| 8,183,936 | B2 | * | 5/2012  | Chen et al. ....................... 331/17 |
| 8,476,946 | B2 | * | 7/2013  | Teng .............................. 327/156 |
| 2010/0171533 | A1 | * | 7/2010 | Okamoto et al. ............. 327/156 |
| 2011/0115531 | A1 | * | 5/2011 | Okamoto et al. ............. 327/117 |
| 2011/0175682 | A1 | * | 7/2011 | Chen et al. ....................... 331/17 |
| 2011/0227614 | A1 | * | 9/2011 | Anandakumar et al. ....... 327/156 |
| 2012/0256665 | A1 | * | 10/2012 | Teng .............................. 327/156 |

* cited by examiner

*Primary Examiner* — Adam Houston
(74) *Attorney, Agent, or Firm* — Winston Hsu; Scott Margo

(57) ABSTRACT

A delay lock loop includes a phase frequency detector, a loop filter, and a voltage controlled delay circuit. The phase frequency detector is used for outputting an upper switch signal or a lower switch signal according to a reference clock and a feedback clock. The loop filter includes a first capacitor, a second capacitor, and a first switch. The first capacitor is charged or discharged and the first switch is turned off during a phase tracking period. The first capacitor and the second capacitor are charged or discharged and the first switch is turned on during a phase locking period. The voltage controlled delay circuit is used for outputting the feedback clock according to the reference clock and a control voltage outputted by the loop filter.

5 Claims, 9 Drawing Sheets

LOOP FILTER

CROSS REFERENCE TO RELATED APPLICATIONS

This is a continuation application of U.S. patent application Ser. No. 13/433,278, filed on Mar. 28, 2012, and all benefits of such earlier application are hereby claimed for this new continuation application.

BACKGROUND OF THE INVENTION

1. Field of the Invention

The present invention is related to a delay lock loop, a loop filter, and a method of phase locking of a delay lock loop, and particularly to a delay lock loop that has a switched capacitor loop filter, a loop filter that has a switched capacitor, and a method of phase locking of a delay lock loop that has a switched capacitor loop filter.

2. Description of the Prior Art

Please refer to FIG. 1. FIG. 1 is a diagram illustrating a delay lock loop 100 according to the prior art. The delay lock loop 100 includes a phase frequency detector 102, a charge pump 104, a voltage control delay line 106, and a capacitor C. The phase frequency detector 102 is used for receiving a reference clock REF and a feedback clock FB, and outputting an upper switch signal UP or a lower switch signal DN according to the reference clock REF and the feedback clock FB. The charge pump 104 is used for charging or discharging according to the upper switch signal UP or the lower switch signal DN, and outputting a control voltage VCTRL (that is, a voltage of the capacitor C). The voltage control delay line 106 adjusts the feedback clock FB to synchronize the reference clock REF and the feedback clock FB according to the control voltage VCTRL and the reference clock REF. In addition, an enabling signal CKE can enable and disable the delay lock loop 100.

Please refer to FIG. 2A and FIG. 2B. FIG. 2A is a diagram illustrating decrease of the control voltage VCTRL due to leakage of the capacitor C when the delay lock loop 100 enters a power down mode, and FIG. 2B is a diagram illustrating the delay lock loop 100 having a phase error due to the decrease of the control voltage VCTRL when the delay lock loop 100 is enabled again. When the delay lock loop 100 enters the power down mode (that is, the enabling signal CKE for enabling the delay lock loop 100 is at a logic-low voltage), the phase frequency detector 102, the charge pump 104, and the voltage control delay line 106 are disabled. Therefore, amount of charge stored in the capacitor C is decreased gradually until the delay lock loop 100 is enabled again. As shown in FIG. 2A, when the delay lock loop 100 is in the power down mode, voltage variation caused by decreasing charge of the capacitor C with a large capacitance (large resistor-capacitor time constant) is less than voltage variation caused by decreasing charge of the capacitor C with a small capacitance (small resistor-capacitor time constant). Therefore, as shown in FIG. 2B, when the delay lock loop 100 leaves the power down mode (that is, the enabling signal CKE for enabling the delay lock loop 100 is at a logic-high voltage), a phase error caused by the capacitor C with the large capacitance is less than a phase error caused by the capacitor C with the small capacitance.

Please refer to FIG. 3. FIG. 3 is a diagram illustrating the charge pump 104. When the charge pump 104 receives the upper switch signal UP, an upper current source 1042 charges the capacitor C according to a current IU; when the charge pump 104 receives the lower switch signal DN, the lower current source 1044 discharges the capacitor C according to a current ID, where the current IU is equal to the current ID. Loop bandwidth Wn of the delay lock loop 100 is determined by equation (1):

$$Wn = \frac{IU \times K_{VCDL}}{T \times C} \quad (1)$$

As shown in equation (1), $K_{VCDL}$ is a gain of the voltage control delay line 106, and T is a period of the reference clock REF of the delay lock loop 100. In addition, a locking time LT of the delay lock loop 100 and the loop bandwidth Wn are inversely proportional. Therefore, the delay lock loop 100 with the capacitor C with the small capacitance has shorter locking time LT. However, the feedback clock FB outputted by the delay lock loop 100 with the capacitor C with the small capacitance has large jitter.

In the prior art, the delay lock loop 100 usually has a capacitor C with a large capacitance to reduce jitter of the feedback clock FB and the leakage of the capacitor C when the delay lock loop 100 enters the power down mode, and the delay lock loop 100 also has large charging/discharging currents (IU·ID) to reduce the locking time LT. However, the delay lock loop 100 with the capacitor C with the large capacitance has a problem of large power consumption due to the large charging/discharging currents.

SUMMARY OF THE INVENTION

An embodiment provides a delay lock loop. The delay lock loop includes a phase frequency detector, a loop filter, and a voltage control delay line. The phase frequency detector has a first input terminal for receiving a reference clock, a second input terminal for receiving a feedback clock, a first output terminal for outputting an upper switch signal, and a second output terminal for outputting a lower switch signal. The loop filter has a first input terminal for receiving the upper switch signal, a second input terminal for receiving the lower switch signal, and an output terminal for outputting a control voltage, where the loop filter includes a first capacitor, a second capacitor, and a first switch. The first switch is coupled between a first terminal of the first capacitor and a first terminal of the second capacitor, where the first capacitor is charged/discharged and the first switch is turned off when the loop filter is in phase tracking, and the first switch is turned on when the loop filter is in phase locking. The voltage control delay line has a first input terminal for receiving the reference clock, a second input terminal coupled to the output terminal of the loop filter for receiving the control voltage, and an output terminal for outputting the feedback clock.

Another embodiment provides a loop filter. The loop filter includes an upper circuit, a lower circuit, a first capacitor, a second capacitor, a buffer, a first switch, and a second switch. The upper circuit has a first terminal for receiving a first voltage, a second terminal coupled to the output terminal of the loop filter, and a third terminal coupled to the first input terminal of the loop filter. The lower circuit has a first terminal coupled to the output terminal of the loop filter, a second terminal coupled to ground, and a third terminal coupled to the second input terminal of the loop filter. The first capacitor has a first terminal coupled to the output terminal of the loop filter, and a second terminal coupled to the ground. The second capacitor has a first terminal, and a second terminal coupled to the ground. The buffer has a first terminal coupled to the output terminal of the loop filter, and a second terminal.

The first switch is coupled to between the first terminal of the first capacitor and the first terminal of the second capacitor. The second switch is coupled to between the second terminal of the buffer and the first terminal of the second capacitor. The first capacitor is charged/discharged and the first switch is turned off when the loop filter is in phase tracking, and the first switch is turned on when the loop filter is in phase locking.

Another embodiment provides a method of phase locking of a delay lock loop. The method includes a phase frequency detector outputting an upper switch signal or a lower switch signal according to a reference clock and a feedback clock; a loop filter charging/discharging a first capacitor according to the upper switch signal/the lower switch signal when the loop filter is in phase tracking, charging/discharging a second capacitor by a buffer, and outputting a control voltage; a voltage control delay line synchronizing the feedback clock with the reference clock according to the control voltage and the reference clock, and outputting the feedback clock.

The present invention provides a delay lock loop, a loop filter, and a method of phase locking of a delay lock loop. The delay lock loop, the loop filter, and the method utilize a first switch and a second switch of a loop filter to change capacitor values when the loop filter is in phase tracking and phase locking. Therefore, when the loop filter is in the phase tracking, the loop filter only utilizes a voltage of a smaller capacitor (a first capacitor) to control a voltage control delay line for locking fast; and when the loop filter is in the phase locking, the loop filter utilizes a voltage of a larger capacitor (the first capacitor and a second capacitor in parallel) to control the voltage control delay line. Therefore, the present invention has shorter locking time, lower power consumption, lower jitter, and no phase shift caused by mismatched switch currents, and can enter the power down mode for a long time.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
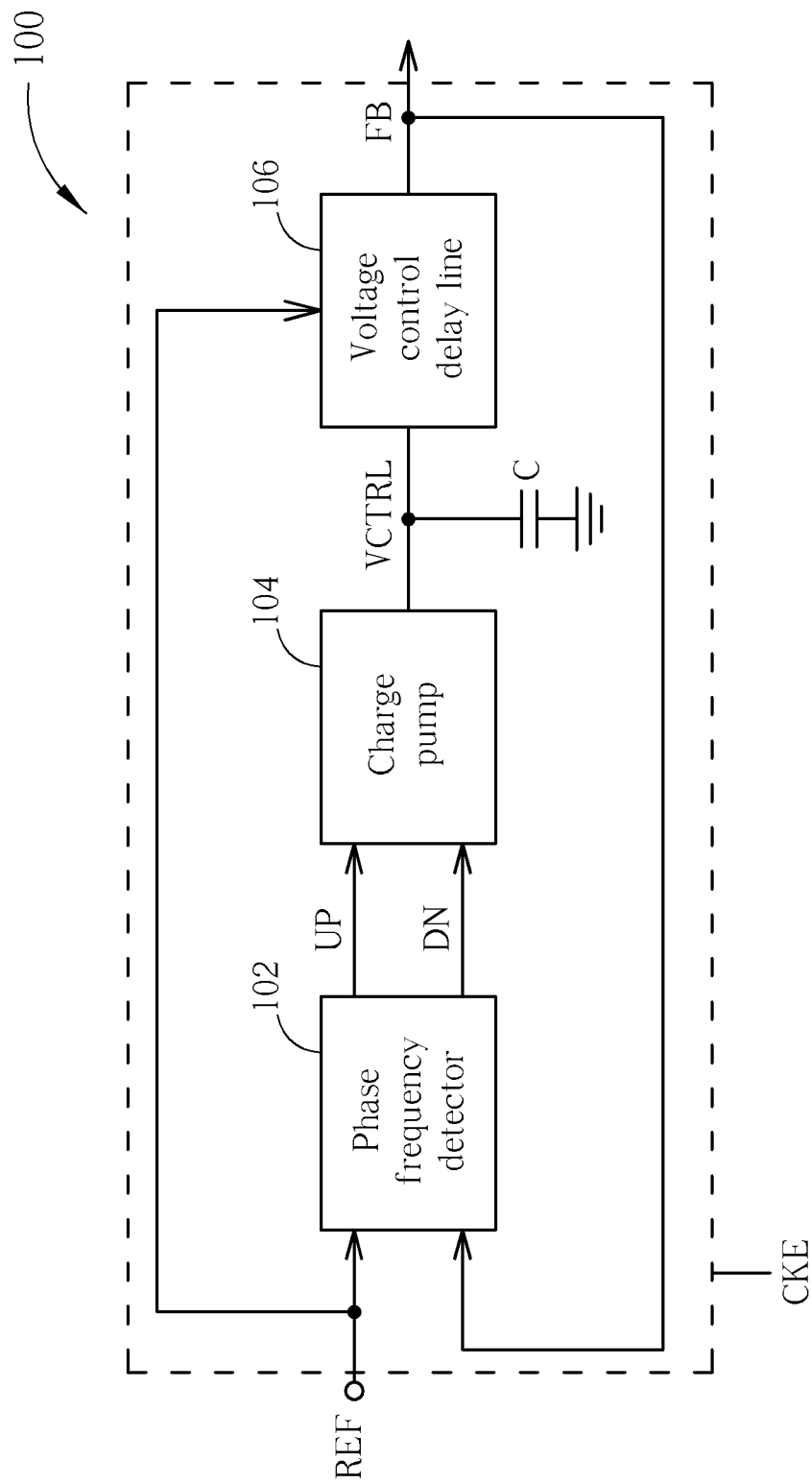
FIG. 1 is a diagram illustrating a delay lock loop according to the prior art.
Figure 2A:
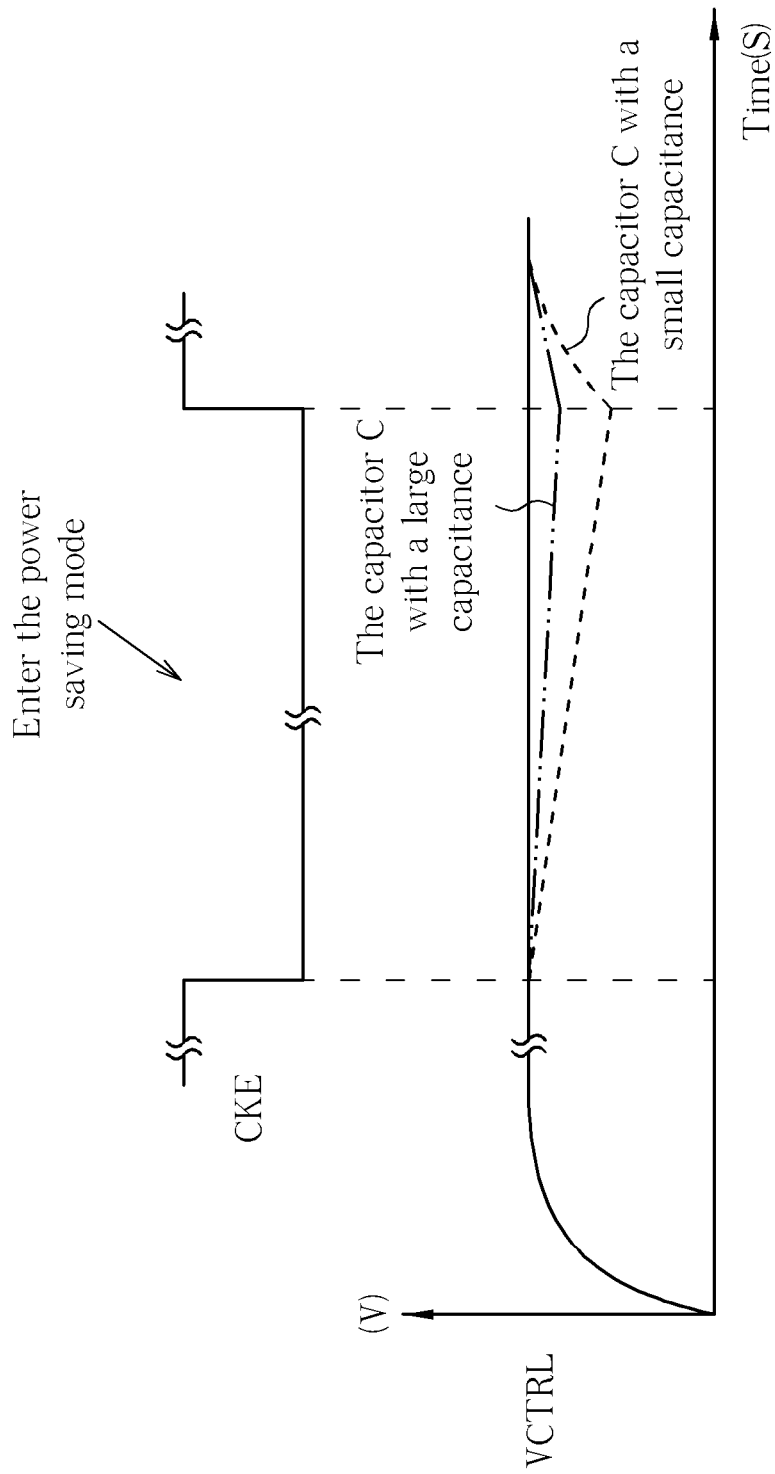
FIG. 2A is a diagram illustrating decrease of the control voltage due to leakage of the capacitor when the delay lock loop enters a power down mode.
Figure 2B:
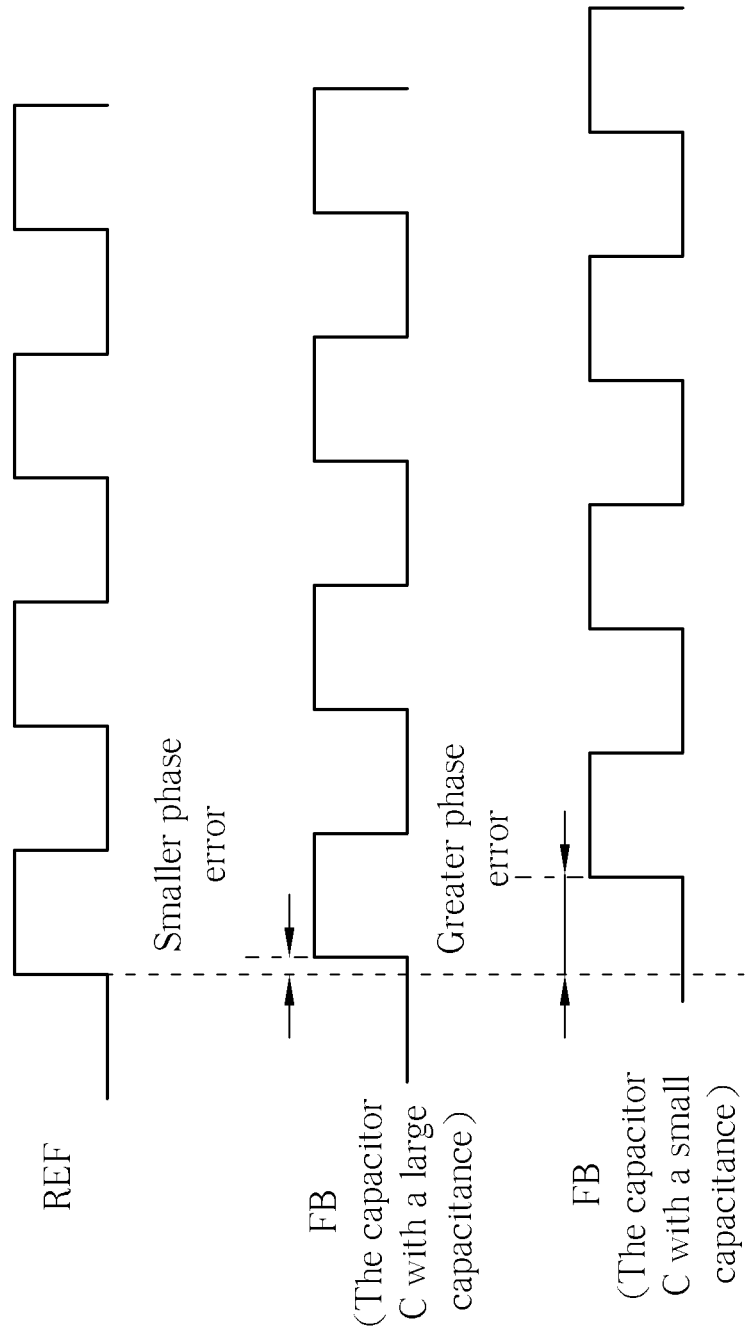
FIG. 2B is a diagram illustrating the delay lock loop having a phase error due to the decrease of the control voltage when the delay lock loop is enabled again.
Figure 3:
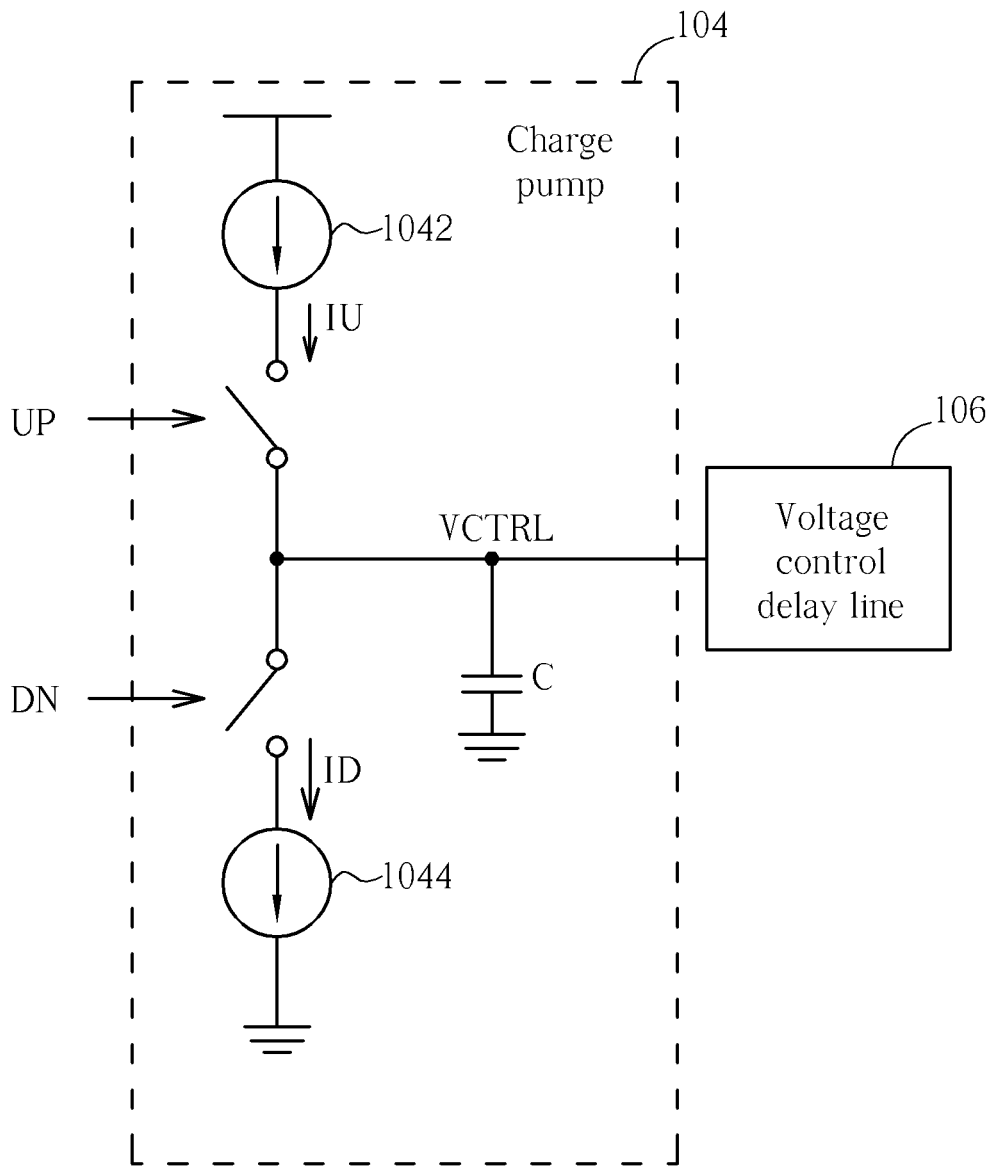
FIG. 3 is a diagram illustrating the charge pump.
Figure 4:
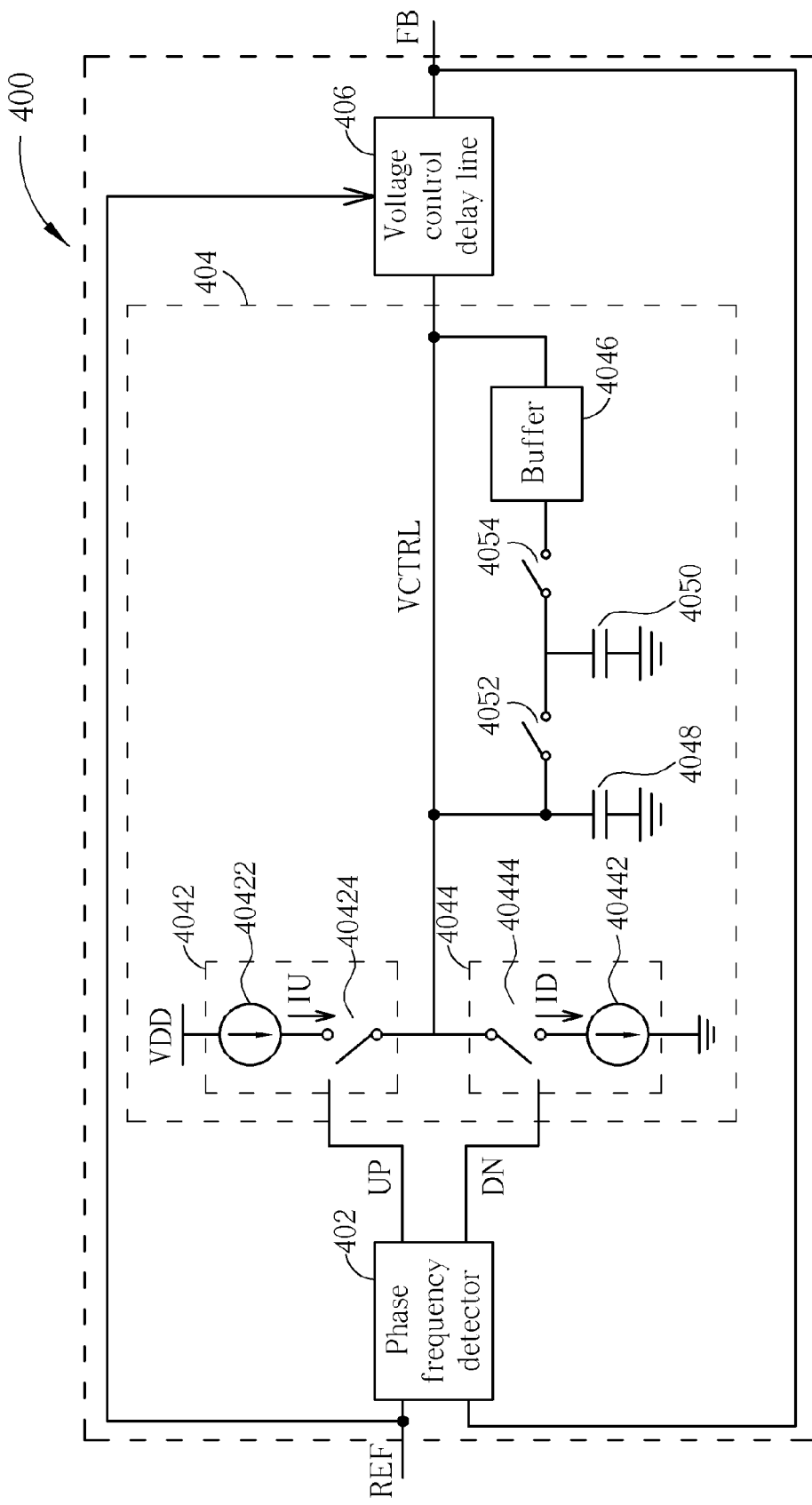
FIG. 4 is a diagram illustrating a delay lock loop according to an embodiment.

Please refer to FIG. 4. FIG. 4 is a diagram illustrating a delay lock loop 400 according to an embodiment. The delay lock loop 400 includes a phase frequency detector 402, a loop filter 404, and a voltage control delay line 406. The phase frequency detector 402 has a first input terminal for receiving a reference clock REF, a second input terminal for receiving a feedback clock FB, a first output terminal for outputting an upper switch signal UP, and a second output terminal for outputting a lower switch signal DN, where when a phase of the feedback clock FB leads a phase of the reference clock REF, the upper switch signal UP is at a logic-low voltage and the lower switch signal DN is at a logic-high voltage; and when the phase of the feedback clock FB lags the phase of the reference clock REF, the upper switch signal UP is at the logic-high voltage and the lower switch signal DN is at the logic-low voltage. But, when the phase of the feedback clock FB leads the phase of the reference clock REF, the upper switch signal UP can also be at the logic-high voltage and the lower switch signal DN can be at the logic-low voltage; and when the phase of the feedback clock FB lags the phase of the reference clock REF, the upper switch signal UP can also be at the logic-low voltage and the lower switch signal DN can also be at the logic-high voltage. Meanwhile, the loop filter 404 can only utilize a logic circuit further included by the loop filter 404 to invert a logic voltage of the upper switch signal UP and a logic voltage of the lower switch signal DN.

The loop filter 404 has a first input terminal for receiving the upper switch signal UP, a second input terminal for receiving the lower switch signal DN, and an output terminal for outputting a control voltage VCTRL. The loop filter 404 includes an upper circuit 4042, a lower circuit 4044, a buffer 4046, a first capacitor 4048, a second capacitor 4050, a first switch 4052, and a second switch 4054, where the first switch 4052 and the second switch 4054 are P-type metal-oxide-semiconductor transistors, N-type metal-oxide-semiconductor transistors, or transmission gates. The upper circuit 4042 has a first terminal for receiving a first voltage VDD, a second terminal coupled to the output terminal of the loop filter 404, and a third terminal coupled to the first input terminal of the loop filter 404 for receiving the upper switch signal UP. The upper circuit 4042 includes an upper current source 40422 and an upper switch 40424, where the upper switch 40424 is a P-type metal-oxide-semiconductor transistor, an N-type metal-oxide-semiconductor transistor, or a transmission gate. The upper current source 40422 has a first terminal coupled to the first terminal of the upper circuit 4042, and a second terminal. The upper switch 40424 has a first terminal coupled to the second terminal of the upper current source 40422, a second terminal coupled to the second terminal of the upper circuit 4042, and a third terminal coupled to the third terminal of the upper circuit 4042. The lower circuit 4044 has a first terminal coupled to the output terminal of the loop filter 404, a second terminal coupled to ground, and a third terminal coupled to the second input terminal of the loop filter 404 for receiving the lower switch signal DN. The lower circuit 4044 includes a lower current source 40442 and a lower switch 40444, where the lower switch 40444 is a P-type metal-oxide-semiconductor transistor, an N-type metal-oxide-semiconductor transistor, or a transmission gate. The lower current source 40442 has a first terminal, and a second terminal coupled to the second terminal of the lower circuit 4044. The lower switch 40444 has a first terminal coupled to the first terminal of the lower circuit 4044, a second terminal coupled to the first terminal of the lower current source 40442, and a third terminal coupled to the third terminal of the lower circuit 4044. The first capacitor 4048 has a first terminal coupled to the output terminal of the loop filter 404, and a second terminal coupled to the ground. The second capacitor 4050 has a first terminal, and a second terminal coupled to the ground.

The first switch 4052 is coupled between the first terminal of the first capacitor 4048 and the first terminal of the second capacitor 4050. The buffer 4046 has a first terminal coupled to the output terminal of the loop filter 404, and a second terminal. The second switch 4054 is coupled between the second terminal of the buffer 4046 and the first terminal of the second capacitor 4050. In addition, an enabling signal CKE can enable and disable the delay lock loop 400.

Figure 5A:
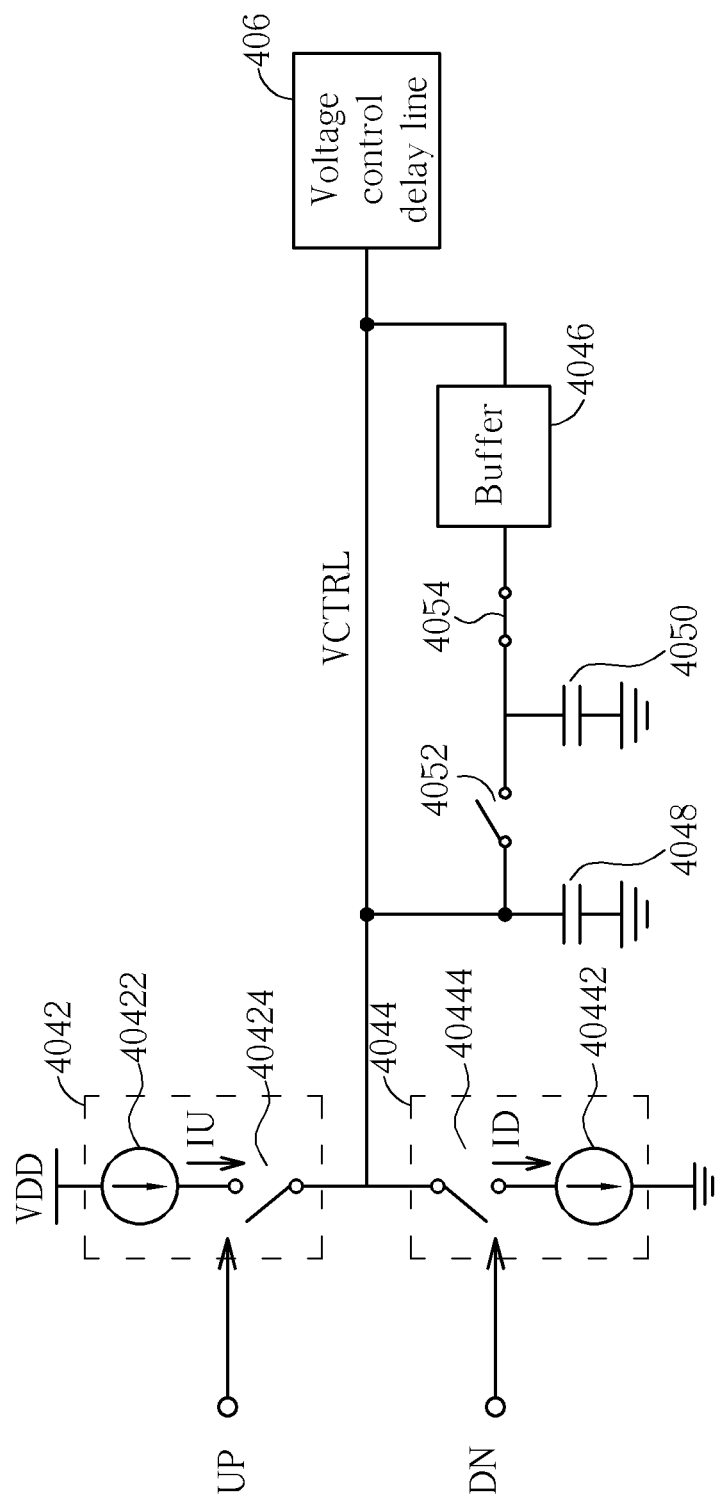
FIG. 5A is a diagram illustrating operation of the loop filter when the loop filter is in the phase tracking.
Figure 5B:
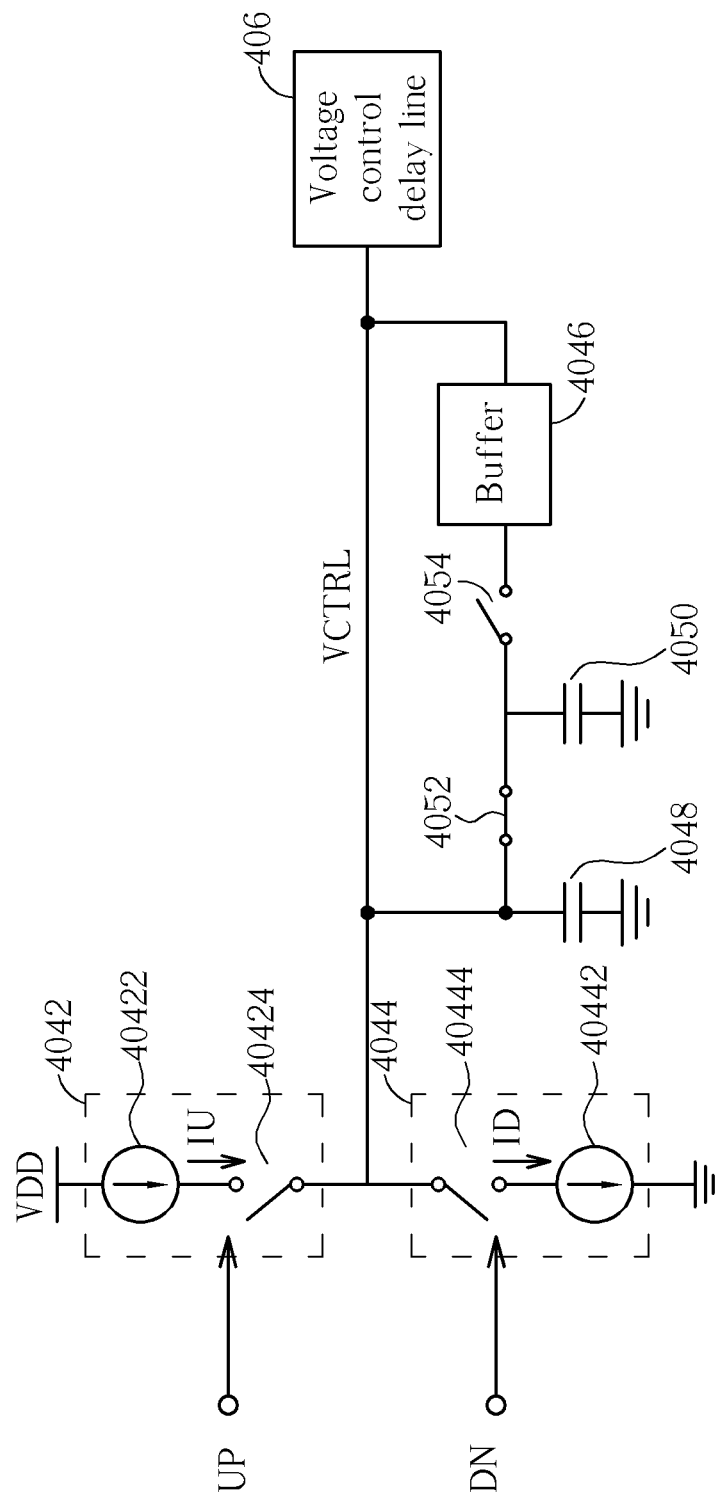
FIG. 5B is a diagram illustrating operation of the loop filter when the loop filter is in the phase locking.
Figure 5C:
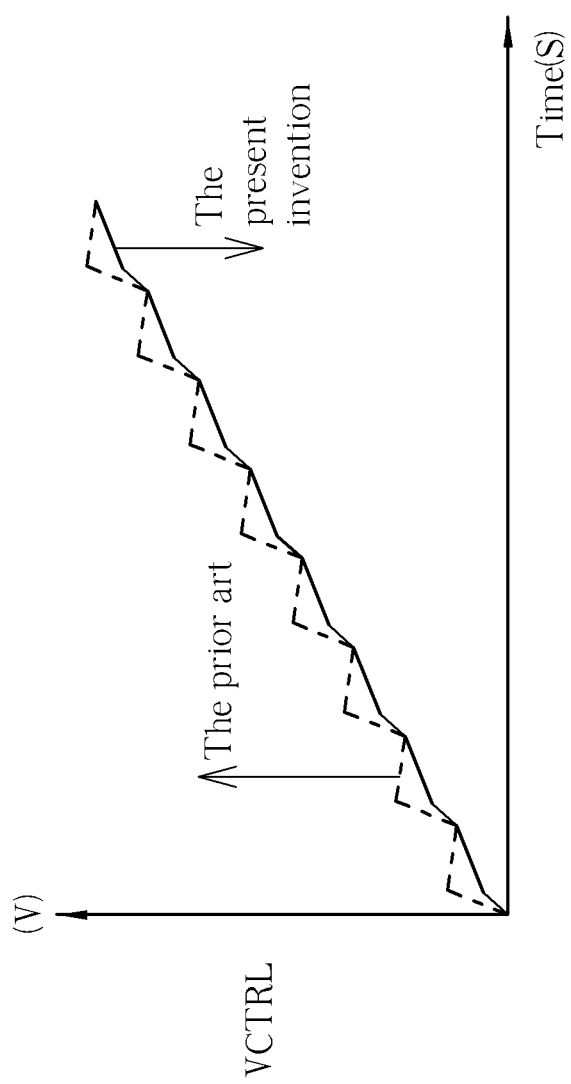
FIG. 5C is a diagram illustrating the loop filter outputting the control voltage VCTRL according to charge variation of the first capacitor and the second capacitor.

Please refer to FIG. 5A, FIG. 5B, and FIG. 5C. FIG. 5A is a diagram illustrating operation of the loop filter 404 when the loop filter 404 is in the phase tracking, FIG. 5B is a diagram illustrating operation of the loop filter 404 when the loop filter 404 is in the phase locking, and FIG. 5C is a diagram illustrating the loop filter 404 outputting the control voltage VCTRL according to charge variation of the first capacitor 4048 and the second capacitor 4050. As shown in FIG. 5A, when the loop filter 404 is in the phase tracking, the first switch 4052 is turned off, the second switch 4054 is turned on, and the buffer 4046 is enabled. Meanwhile, if the upper switch signal UP is at the logic-high voltage and the lower switch signal DN is at the logic-low voltage, the upper switch 40424 is turned on and the upper circuit 4042 charges the first capacitor 4048 according to a current IU (the second capacitor 4050 is isolated by the first switch 4052, so the second capacitor 4050 is not charged by the upper circuit 4042); if the upper switch signal UP is at the logic-low voltage and the lower switch signal DN is at the logic-high voltage, the lower switch 40444 is turned on and the lower circuit 4044 discharges the first capacitor 4048 according to a current ID (the second capacitor 4050 is isolated by the first switch 4052, so the second capacitor 4050 is not discharged by the lower circuit 4044). The output terminal of the loop filter 404 outputs the control voltage VCTRL to the voltage control delay line 406 according to a voltage of the first capacitor 4048. In addition, because the first switch 4052 is turned off, the second switch 4054 is turned on, and the buffer 4046 is enabled, the second capacitor 4050 is charged/discharged by the buffer 4046 when the loop filter 404 is in the phase tracking. Thus, because the loop filter 404 only charges/discharges the first capacitor 4048 when the loop filter 404 is in the phase tracking, the delay lock loop 400 has shorter locking time LT, lower current ID, and lower current IU.

As shown in FIG. 5B, when the loop filter 404 is in the phase locking, the first switch 4052 is turned on and the second switch 4054 is turned off. In addition, when the loop filter 404 is in the phase locking, the delay lock loop 400 can save power if the buffer 4046 is disabled. When the loop filter 404 is in the phase locking, the upper switch 40424 is turned on and the upper circuit 4042 charges the first capacitor 4048 and the second capacitor 4050 according to the current IU if the upper switch signal UP is at the logic-high voltage and the lower switch signal DN is at the logic-low voltage; and if the upper switch signal UP is at the logic-low voltage and the lower switch signal DN is at the logic-high voltage, the lower switch 40444 is turned on and the lower circuit 4044 discharges the first capacitor 4048 and the second capacitor 4050 according to the current ID. The output terminal of the loop filter 404 outputs the control voltage VCTRL to the voltage control delay line 406 according to a voltage of the first capacitor 4048. In addition, as shown in FIG. 5B, when the loop filter 404 is in the phase locking, a voltage of the output terminal of the loop filter 404 is determined by voltages of the first capacitor 4048 and the second capacitor 4050 if the delay lock loop 400 enters a power down mode, so the voltage of the output terminal of the loop filter 404 is decreased slowly (that is, the control voltage VCTRL is decreased slowly). Thus, after the delay lock loop 400 leaves the power down mode, the loop filter 404 still needs to charge leakages (that is, a decrease in the control voltage VCTRL) of the first capacitor 4048 and the second capacitor 4050 again. However, the delay lock loop 400 has a smaller phase error due to the smaller leakages of the first capacitor 4048 and the second capacitor 4050.

As shown in FIG. 5C, the first capacitor 4048 is charged/discharged only when the loop filter 404 is in the phase tracking. The second capacitor 4050 is charged/discharged by the buffer 4046 when the loop filter 404 is in the phase tracking, and the second capacitor 4050 is charged by the upper circuit 4042 or is discharged by the lower circuit 4044 when the loop filter 404 is in the phase locking. That is to say, the second capacitor 4050 is charged/discharged at all times. Therefore, charge variation of the output terminal of the loop filter 404 is smoother than the prior art.

In addition, the voltage control delay line 406 has a first input terminal for receiving the reference clock REF, a second input terminal coupled to the output terminal of the loop filter 404 for receiving the control voltage VCTRL, and an output terminal for outputting the feedback clock FB. The voltage control delay line 406 adjusts the feedback clock FB to synchronize the feedback clock FB and the reference clock REF according to the control voltage VCTRL and the reference clock REF, and outputs the feedback clock FB.

Figure 6:
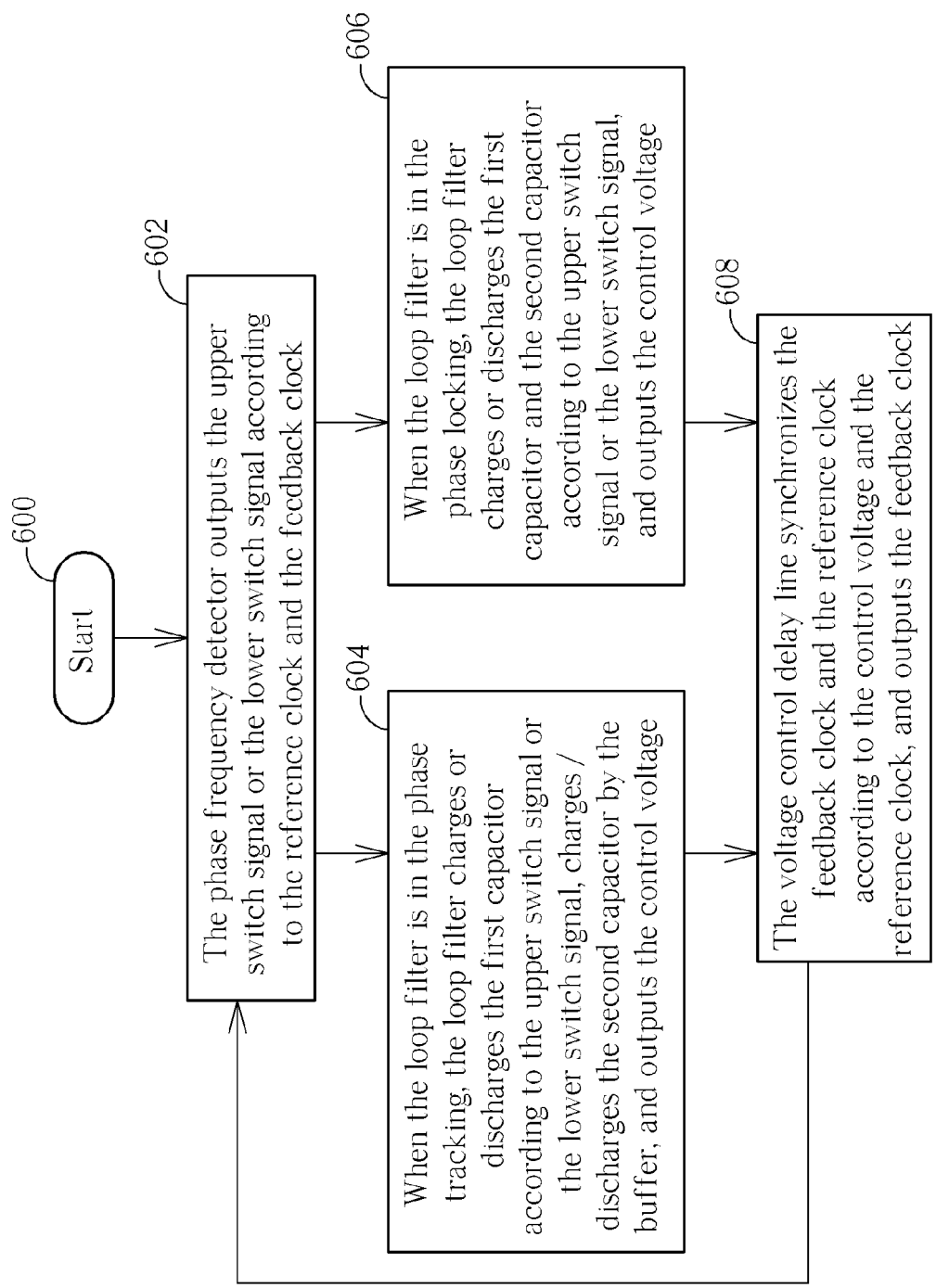
FIG. 6 is a flowchart illustrating a method of phase locking of a delay lock loop according to another embodiment.

Please refer to FIG. 6. FIG. 6 is a flowchart illustrating a method of phase locking of a delay lock loop according to another embodiment. The method in FIG. 6 uses the delay lock loop 400 in FIG. 4 to illustrate the method. Detailed steps are as follows:

Step 600: Start.

Step 602: The phase frequency detector 402 outputs the upper switch signal UP or the lower switch signal DN according to the reference clock REF and the feedback clock FB; go to Step 604 or Step 606.

Step 604: When the loop filter 404 is in the phase tracking, the loop filter 404 charges or discharges the first capacitor 4048 according to the upper switch signal UP or the lower switch signal DN, charges/discharges the second capacitor 4050 by the buffer 4046, and outputs the control voltage VCTRL; go to Step 608.

Step 606: When the loop filter 404 is in the phase locking, the loop filter 404 charges or discharges the first capacitor 4048 and the second capacitor 4050 according to the upper switch signal UP or the lower switch signal DN, and outputs the control voltage VCTRL; go to Step 608.

Step 608: The voltage control delay line 406 synchronizes the feedback clock FB and the reference clock REF according to the control voltage VCTRL and the reference clock REF, and outputs the feedback clock FB; go to Step 602.

In Step 604, when the loop filter 404 is in the phase tracking, the first switch 4052 is turned off, the second switch 4054 is turned on, and the buffer 4046 is enabled. Therefore, the loop filter 404 charges or discharges the first capacitor 4048 according to the upper switch signal UP or the lower switch signal DN, charges/discharges the second capacitor 4050 by the buffer 4046, and outputs the control voltage VCTRL according to the voltage of the first capacitor 4048. In Step 606, when the loop filter 404 is in the phase locking, the first switch 4052 is turned on and the second switch 4054 is turned off. Therefore, the loop filter 404 charges or discharges the first capacitor 4048 and the second capacitor 4050 according to the upper switch signal UP or the lower switch signal DN, and outputs the control voltage VCTRL according to the voltages of the first capacitor 4048 and the second capacitor 4050. In addition, when the loop filter 404 is in the phase locking, the delay lock loop 400 can save power if the buffer 4046 is disabled. In Step 608, the voltage control delay line 406 adjusts the feedback clock FB to synchronize the feedback clock FB and the reference clock REF according to the control voltage VCTRL and the reference clock REF, and outputs the feedback clock FB.

To sum up, the delay lock loop, the loop filter, and the method of phase locking of the delay lock loop utilize the first switch and the second switch of the loop filter to change capacitor values when the loop filter is in the phase tracking and the phase locking. Therefore, when the loop filter is in the phase tracking, the loop filter only utilizes a voltage of a smaller capacitor (the first capacitor) to control the voltage control delay line for locking fast; and when the loop filter is in the phase locking, the loop filter utilizes a voltage of a larger capacitor (the first capacitor and the second capacitor in parallel) to control the voltage control delay line. Therefore, the present invention has shorter locking time, lower power consumption, lower jitter, and no phase shift caused by mismatched switch currents, and can enter the power down mode for a long time. In addition, the loop filter provided by the present invention is not only applied to the delay lock loop but also to an analog pulse width control loop.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A loop filter, comprising:
   a first input terminal for receiving an upper switch signal;
   a second input terminal for receiving a lower switch signal;
   an output terminal for outputting a control voltage;
   a first capacitor having a first terminal coupled to the output terminal of the loop filter, and a second terminal coupled to ground;
   a second capacitor having a first terminal, and a second terminal coupled to the ground; and
   a first switch coupled between the first terminal of the first capacitor and the first terminal of the second capacitor;
   wherein the first capacitor is charged/discharged and the first switch is turned off in phase tracking, and the first switch is turned on in phase locking.

2. The loop filter of claim 1, further comprising:
   an upper circuit having a first terminal for receiving a first voltage, a second terminal coupled to the output terminal of the loop filter, and a third terminal coupled to the first input terminal of the loop filter for receiving the upper switch signal;
   a lower circuit having a first terminal coupled to the output terminal of the loop filter, a second terminal coupled to the ground, and a third terminal coupled to the second input terminal of the loop filter for receiving the lower switch signal;
   a buffer having a first terminal coupled to the output terminal of the loop filter, and a second terminal; and
   a second switch coupled between the second terminal of the buffer and the first terminal of the second capacitor;
   wherein the second switch is turned on in the phase tracking, and is turned off in the phase locking.

3. The loop filter of claim 1, wherein the buffer is disabled in the phase locking.

4. The loop filter of claim 1, wherein the upper circuit comprises:
   an upper current source having a first terminal coupled to the first terminal of the upper circuit, and a second terminal; and
   an upper switch having a first terminal coupled to the second terminal of the upper current source, a second terminal coupled to the second terminal of the upper circuit, and a third terminal coupled to the third terminal of the upper circuit.

5. The loop filter of claim 1, wherein the lower circuit comprises:
   a lower current source having a first terminal, and a second terminal coupled to the second terminal of the lower circuit; and
   a lower switch having a first terminal coupled to the first terminal of the lower circuit, a second terminal coupled to the first terminal of the lower current source, and a third terminal coupled to the third terminal of the lower circuit.

* * * * *

UNITED STATES PATENT AND TRADEMARK OFFICE
CERTIFICATE OF CORRECTION

| | | |
|---|---|---|
| PATENT NO. | : 8,531,220 B1 | Page 1 of 1 |
| APPLICATION NO. | : 13/901575 | |
| DATED | : September 10, 2013 | |
| INVENTOR(S) | : Kuang-Fu Teng | |

It is certified that error appears in the above-identified patent and that said Letters Patent is hereby corrected as shown below:

On the title page, under item (63), insert item (30)

--(30) Foreign Application Priority Data
Apr. 07, 2011   (TW).................100112095--.

Signed and Sealed this
Nineteenth Day of November, 2013

Teresa Stanek Rea
*Deputy Director of the United States Patent and Trademark Office*